(12) United States Patent
Brigati et al.

(10) Patent No.: US 6,279,068 B2
(45) Date of Patent: Aug. 21, 2001

(54) SET OF TWO MEMORIES ON THE SAME MONOLITHIC INTEGRATED CIRCUIT

(75) Inventors: Alessandro Brigati; Jean Devin, both of Aix en Provence; Bruno Leconte, Rousset, all of (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/746,472

(22) Filed: Dec. 21, 2000

Related U.S. Application Data

(62) Division of application No. 09/056,921, filed on Apr. 8, 1998, now Pat. No. 6,205,512.

(30) Foreign Application Priority Data

Apr. 8, 1997 (FR) .................................................. 97 04285

(51) Int. Cl.⁷ .................................................. G06F 12/00
(52) U.S. Cl. .......................... 711/100; 711/102; 711/103; 711/148; 365/230.03; 712/232
(58) Field of Search ................................... 711/100, 102, 711/103, 148, 167; 700/5; 712/232; 365/230.01, 230.03

(56) References Cited

U.S. PATENT DOCUMENTS

| | | | |
|---|---|---|---|
| 4,660,181 | 4/1987 | Saito et al. | 365/230 |
| 4,667,190 | 5/1987 | Fant | 340/747 |
| 4,924,427 | * 5/1990 | Savage et al. | 364/900 |
| 5,325,508 | * 6/1994 | Parks et al. | 395/425 |
| 5,349,578 | 9/1994 | Tatsuki et al. | 370/13 |
| 5,455,912 | 10/1995 | Ludwig | 395/293 |
| 5,479,635 | * 12/1995 | Kametani | 395/405 |
| 5,517,639 | * 5/1996 | Yamaguchi | 395/550 |
| 5,615,355 | * 3/1997 | Wagner | 395/494 |
| 5,774,135 | * 6/1998 | Letham | 345/516 |
| 5,962,930 | * 10/1999 | Cluff et al. | 307/66 |
| 6,052,133 | * 4/2000 | Kang | 345/521 |
| 6,205,512 | * 3/2001 | Brigati et al. | 711/100 |

FOREIGN PATENT DOCUMENTS

| | | | |
|---|---|---|---|
| 0 411 633 | 2/1991 | (EP) | G11C/8/00 |
| 0 481 437 | 4/1992 | (EP) | G11C/7/00 |
| 407200028A | * 8/1995 | (JP) . | |

OTHER PUBLICATIONS

French Search Report from French priority application No. 97 04285.

* cited by examiner

*Primary Examiner*—Viet Q. Nguyen
(74) *Attorney, Agent, or Firm*—Wolf, Greenfield & Sacks, P.C.; James H. Morris; Theodore E. Galanthay

(57) ABSTRACT

Two different types of memory are integrated on the same type of integrated circuit. A microcontroller is associated with each of these memories. In order that the independence of operation of these microcontrollers may be ensured, they are each provided with time delay circuits whose role is to maintain the read or write operation of one microcontroller when another is selected.

4 Claims, 2 Drawing Sheets

SET OF TWO MEMORIES ON THE SAME MONOLITHIC INTEGRATED CIRCUIT

This application is a division of application Ser. No. 09/056,921, filed Apr. 8, 1998, now U.S. Pat No. 6,205,512 entitled SET OF TWO MEMORIES ON THE SAME MONOLITHIC INTEGRATED CIRCUIT, and now allowed.

BACKGROUND OF THE INVENTION

1. Field of the Invention

The invention relates to a monolithic integrated circuit comprising two memories that are preferably distinct from each other and electronic circuits making it possible for the two memories to work simultaneously.

It can be applied especially to electrically erasable and programmable non-volatile memories or EEPROMs, flash EPROMs or battery-saved memories. Each of the memory cells of these first two types of memories consists of a floating-gate transistor comprising a control gate, a floating gate, a source region and a drain region. To read or write in a memory cell of this kind, specific voltages are applied to connections that lead to these cells. These voltages depend on the types of memory.

2. Discussion of the Related Art

For example, to program a memory cell in an EEPROM memory, a high positive voltage is applied to the word line connected to the control gate of the floating-gate transistor of the memory cell and zero voltage is applied to the bit line connected to the drain region. The application of these voltages creates a high voltage across the narrow oxide layer. The result of this high voltage is the migration of electrons towards the floating gate. These electrons are trapped in the floating gate. This phenomenon is called a tunnel phenomenon.

In another example, to program a flash EEPROM type memory, the voltages applied to the various electrodes of a memory cell are different. During a programming operation, a positive high voltage is applied to the word line of the transistor of a memory cell. An intermediate voltage, for example a positive voltage of the order of 5 volts, is applied to the drain region. Just as in an EEPROM type memory, the application of these voltages prompts a migration of the electrons. This phenomenon is known as a hot carrier phenomenon.

There is therefore a certain degree of disparity between the programming and read voltages. This disparity exists for one and the same memory as well as for different types of memories.

On a monolithic integrated circuit that incorporates, in particular, different types of memories, it is sought however to preserve the possibility of simultaneous operation as if the two memories were not on the same integrated circuit. It is furthermore sought to use different types of memories on the same integrated circuit because the different types of memories lead to different characteristics: greater or lower writing speeds, integration density, bit-by-bit or page-by-page accessibility. A designer may then, with the same integrated circuit, have different possibilities available by which he can organize his work more efficiently.

There is a known way of having one integrated circuit with two memories that are distinct from each other. However, the possibility of executing simultaneous operations on these two memories is limited. Thus it is possible to read and write in a flash EPROM type memory while at the same time reading or writing in an EEPROM type memory, provided that all the useful functions are duplicated. This means the duplication of the buses and circuits to which they are connected. The problem that arises is that these functions then occupy far more space on the integrated circuit and reduce its efficiency. In particular, having two buses is a severe disadvantage. If there is only one bus, the working of the memories is not simultaneous; it is alternating. In that case, there is a loss of time.

SUMMARY OF THE INVENTION

The invention seeks to overcome this problem by enabling the operations of writing or reading in a memory at the same time as it enables writing or reading in another memory, these two memories being present on the same integrated circuit. Preferably, there is only one bus.

In practice, the invention proposes to overcome this problem by enabling the selection of either of the memories and the execution therein of writing or reading operations while the other memory is in read or write mode. The invention takes advantage of the fact that a programming or reading operation lasts for a certain predetermined amount of time, a duration that is specific to each memory. Rather than being encumbered by it, the operation uses the time during which a memory is busy with one of these tasks to isolate it, select the other memory and start making this other memory carry out a read or write operation. A selection signal is therefore used to begin a task. The continuation of the task is conditioned by a hold signal activated by this selection signal.

Thus, an object of the invention is to provide a monolithic integrated circuit comprising two memories that are distinct from each other, a microcontroller for the sequencing of write or read operations in these memories, and a selection circuit capable of selecting either of the memories and receiving a selection signal. According to the invention, the integrated circuit comprises two microcontrollers each linked with one of the memories, wherein each microcontroller has a circuit for the execution, in each memory, of the write or read operations independently of the value of the selection signal.

In one example, to resolve the problem of the specific voltages to be applied for a particular type of memory, load pumps have been duplicated. Thus, the assembly consisting of the microcontroller and the load pump is used to execute programming or read operations in each memory independently of each other.

BRIEF DESCRIPTION OF THE DRAWINGS

The invention will be understood more clearly from the following description and from the appended figures. These figures are given purely by way of example and in no way limit the scope of the invention. Of these figures.

MORE DETAILED DESCRIPTION

Figure 1:
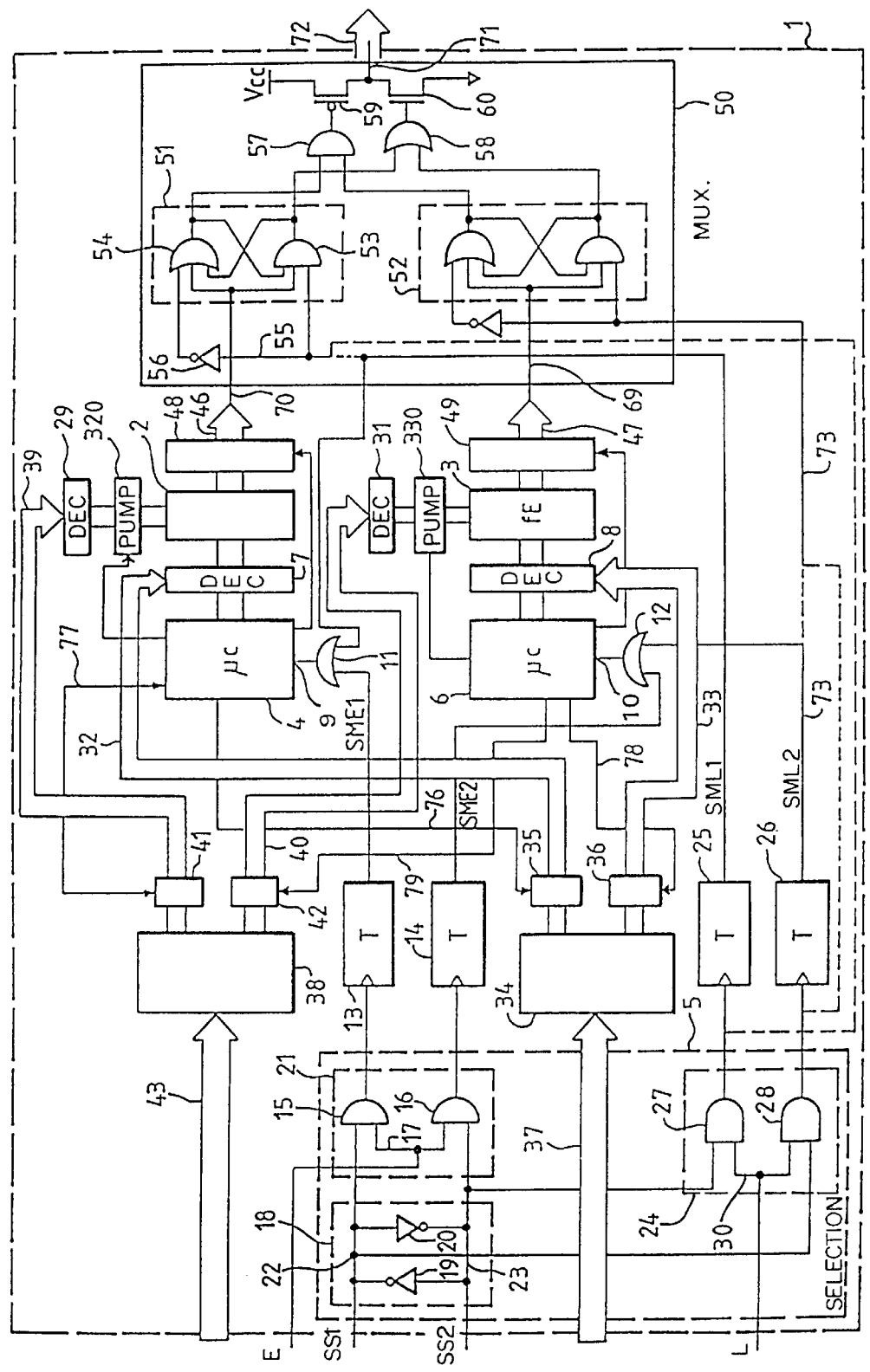
FIG. 1 shows a schematic view of a circuit according to one embodiment of the invention.

FIG. 1 shows an integrated circuit 1 comprising two memories 2 and 3 that are distinct from each other. In one example, in addition to being distinct, the two memories are of different types: the memory 2 is an EEPROM, the memory 3 is a flash EPROM. A microcontroller 4 is capable of prompting the sequential execution of the write and/or read operations in these memories 2 and 3. A microcontroller is a microprocessor provided with a dedicated program memory. A microcontroller in practice can execute only the actions recorded in the program memory. A selection circuit 5 is used to select either of these memories 2 or 3. In one example, a double selection signal SS1 and SS2 is applied to the input of this circuit 5. The signals SS1 and SS2 are complementary. According to one embodiment of the invention, the integrated circuit 1 has a second microcontroller 6 of the same type. The two microcontrollers 4 and 6 are each linked with one of the memories 2 and 3 respectively.

An address decoder 7 is controlled by the microcontroller 4. The decoder 7 provides for access to the memory 2. Similarly, an address decoder 8 is controlled by the microcontroller 6. The decoder 8 provides for access to the memory 3.

According to the invention, each microcontroller 4 and 6 has a circuit, 13 and 14, or, 25 and 26, respectively, for the execution, in each memory, of the write or read operations, independently of the value of the selection signal SS1 or SS2. To this end, an enabling input 9 and 10, to enable each microcontroller 4 and 8, respectively, is connected, in this embodiment, to the output of a two-input OR gate, 11 and 12, respectively. With these two inputs, the two microcontrollers can be enabled in write or read mode.

A first input of each OR gate 11 and 12 is connected to the selection circuit 5 by means of the circuits 13 and 14 capable of generating a write delay signal with a duration T or T'. The circuits 13 and 14 are activated during a write selection and produce a held signal SME1 (write hold signal) for this duration T or SME2 for a duration T'.

The circuits 13 and 14 may, for example, be monostable multivibrator circuits. Alternatively, the circuits 13 and 14 form an integral part, with the OR gates 11 and 12, of the microcontrollers 4 and 6. In this case, the circuits 13 and 14 may be constituted by counting microprograms carried out by the microcontrollers 4 and 6. These counting microprograms count, for example, a predetermined number of pulses of a clock signal produced by or given to the microcontroller.

The duration T of the signal SME1 is chosen in such a way that it is either greater than or equal to a duration of execution of a write operation in the memory 2. There may furthermore be two spells of duration: a lengthy duration T for a write operation, or a duration T for a read operation. The distinction between these two durations is explained further below.

The inputs of the circuits 13 and 14 are connected to outputs of two-input AND gates, respectively, 15 and 16. The gates 15 and 16 form a first logic circuit 21. A first input of the gate 15 is connected to a first input of the gate 16 by a connection 17. The connection 17 receives a write command E common to the two memories 2 and 3. The circuit 21 also receives the selection signals SS1 and SS2 respectively at the two inputs of the gates 15 and 16. These signals provide for the selection of one of the memories 2 or 3 in write mode as a function of the logic level of the two selection signals SS1 or SS2 and of the level of the signal E.

The two inputs of these gates 15 and 16 are connected to connections which convey the selection signals SS1 and SS2 respectively by means of a circuit 18 with two inputs and two outputs. The circuit 18 consists of two inverters 19 and 20 looped in parallel to its two inputs and its two outputs. The circuit 18 selects only one of the two memories at a time. The connection 22 which connects the output of the inverter 19 and the input of the inverter 20 is both an input and an output of this circuit 18 connected to the gate 15. The connection 23 which connects the output of the inverter 20 and the input of the inverter 19 is both a second input and a second output of this circuit 18 connected to the gate 16. The two inputs of the circuit 18 corresponds to the selection signals SS1 and SS2. Only one memory at a time is selected inasmuch as it is not sought to duplicate the storage operations. However, in one use of the circuit in a mirror operation, the circuit 18 may be omitted, the two memories being capable of being selected at the same time.

The OR gates 11 and 12 have a second input. The second inputs of these gates 11 and 12 are similarly connected to a time delay circuit, for example in this case to a monostable multivibrator 25 and 26, respectively. These two circuits 25 and 26 have the same functions as the two circuits 13 and 14 defined above and are similarly connected to the selection circuit 5. The OR gates 11 and 12 receive the held read and write signals (SME1, SME2 and SML1, SML2 according to the read or write mode chosen). They deliver a hold signal during the chosen write operation or read operation in the selected microcontroller.

The selection circuit 5 thus has a second logic circuit 24. This circuit 24 is constituted in a manner identical to that of the circuit 21. It has two AND gates 27 and 28, the outputs of which are connected to the inputs of the circuits 25 and 26 respectively. The circuit 24 has three inputs. A first input of the gate 27 is connected to a first input of the gate 28 by a connection 30 and constitutes a first input of the circuit 24. The connection 30 receives a read command L common to the two memories 2 and 3. The circuit 24, at the second inputs of the gates 27 and 28, also receives the selection signals SS1 and SS2 to select one of these memories 2 or 3. These signals provide for the selection of one memory exclusively.

Each of the memories 2 and 3 has address and data decoder circuits 7 and 29 and 8 and 31 respectively. In accordance with this embodiment of the invention, the address decoders are duplicated to provide for an address decoding operation for each of the memories 2 and 3, independently of each other. The address decoder 7 is connected to the microcontroller 4 and to the word lines of the memory 2. The decoder 8 is connected to the microcontroller 6 and to the word lines of the memory 3. These decoders 7 and 8 receive the addresses to be decoded by address buses 32 and 33, respectively, the number of lines of which is characteristic of the memories 2 and 3. Buses 32 and 33 both come from the same address demultiplexing circuit 34. At its input, the circuit 34 receives an address bus 37 common to the two memories 2 and 3. The bus 37 is connected to the pins (not shown) of the integrated circuit 1. Buffer memories 35 and 36, respectively, controlled by the microcontrollers 4 and 6 respectively, are used to store the address bits transmitted by the demultiplexer 34.

The two memories 2 and 3 are connected to another data decoder, 29 and 31 respectively. The decoders 29 and 31 receive data signals to be applied to the bit lines of the memories 2 and 3. Load pumps 320 and 330 are connected respectively to the outputs of the decoder 29 and to the memory 2, and to the outputs of the decoder 31 and to the memory 3. The load pumps are controlled by the microcontroller that corresponds to them. Through these pumps, the lines of each of the memories can be biased independently of each other. Indeed, the presence of these pumps makes it possible for the lines of each of the memories 2 and 3 to be biased at different potentials and hence provides for simultaneous reading and writing in each of the memories.

Each decoder 29 and 31 is connected to a data bus 39 and 40 respectively coming from a data demultiplexing circuit 38. In order to store the data to be programmed, buffer memories 41 and 42 are installed on these buses 39 and 40 respectively at output of the demultiplexer 38. These buffer memories 41 and 42 are controlled by the microcontrollers 4 and 6 respectively. The demultiplexer 38 is connected at its input to a data bus 43 common to the two memories. The bus 43 is connected to the exterior of the circuit 1.

Each memory 2 or 3 may comprise a data output bus 46 and 47 respectively. These buses 46 and 47 are connected to the memories 2 and 3 by read circuits 48 and 49 respectively, controlled by the microcontrollers 4 and 6. As a variant, the circuits 48, 29 and 32 are connected to one and the same input/output bus 39–46. Similarly, as a variant, the circuits 49, 31 and 33 are connected to the same data input/output bus 40–47. In this case, the circuits 48 and 29 and 49 and 31 are in the form of a single circuit. Further, the demultiplexer 38 may be used as a multiplexer to deliver output data from the bus 43.

An explanation shall now be given of the operation of the multiplexer according to this embodiment of the invention. The circuits 48 and 49 deliver data elements at their output. The number of bits of these data elements depends on the number of lines of the buses 39 or 40. In one embodiment of the invention, there are eight-bit lines each time, and eight-bit words are formed. Each of the bits read in a word in a memory is applied to the input of a two-input multiplexer element 50. The other input of this multiplexer element 50 is dedicated to a bit read in a word in the other memory. Preferably, there is a correspondence between the length of the words read or written in a memory and the length of those read or written in another memory. However, this is not obligatory. There are as many multiplexer elements 50 as there are bits in the longest word to be read.

The multiplexer element 50 has two identical flip-flop circuits 51 and 52 at its input. The inputs of the flip-flop circuits 51 and 52 are connected to one of the wires of the buses 46 and 47, respectively. Each flip-flop circuit 51 and 52 consists of two identical gates. For example, the flip-flop circuit 51 has a three-input AND gate 53 and a three-input OR gate 54. A first input of the AND gate 53 is connected by a connection 55 and by an inverter 56 to an input of the OR gate 54. The connection 55 is also connected to the output of the circuit 25. A second input of the gate 53 is connected to the output of the gate 54. Conversely, the output of the gate 53 is connected to a second input of the gate 54. The third inputs of the gates 53 and 54 are connected together to a wire 70 of the bus 46. The second flip-flop circuit 52 included in the multiplexer element 50 is identical to the flip-flop circuit 51 apart from the fact that the signals that control it come from the other delay circuit 26 by a connection 73. Furthermore, a connection 69 equivalent to the connection 70 of the first flip-flop circuit is connected to the output of the read circuit 49.

The two flip-flop circuits 51 and 52 each have two outputs. The outputs of the OR gates (54) of the two flip-flop circuits 51 and 52 are connected to the two inputs of a two-input AND gate 57. The outputs of the AND gates (53) of the two flip-flop circuits 51 and 52 are connected to the two inputs of a two-input OR gate 58. These two gates 57 and 58 have their outputs applied to control gates respectively of a P type MOS transistor 59 and an N type MOS transistor 60. These two transistors are series-connected. The source of the transistor 59 is connected to the potential Vcc, which is the supply of the integrated circuit. The drain of the circuit 60 is connected to ground. The output of the multiplexer element 50 is located at the midpoint between the two series-connected transistors 59 and 60.

The midpoint of the transistors 59 and 60 is connected to a connection 71. There are as many connections 71 as there are multiplexer elements 50. The connections 71 together form the bus 72 for the output of data from the integrated circuit 1.

The multiplexer element 50 is connected by the connection 55 to the output of the circuit 25. In this way, it is controlled by the read selection signal L after the conversion of signal L into a signal SML1, which is a held signal, by the circuit 25. The signal SML1 makes it possible for the data coming from the selected memory to output.

In another example, the multiplexer 50 may be controlled directly by the read signal. This approach is shown in dashes in FIG. 1. In this case, the selection signals must be imposed from the exterior of the circuit 1, both at the time of the selection in read mode and at the time of the output of data on the bus 72.

The signal present at the connection 55 makes it possible, as the case may be, to inhibit the flip-flop circuit 51 or to turn it on.

Figure 2:
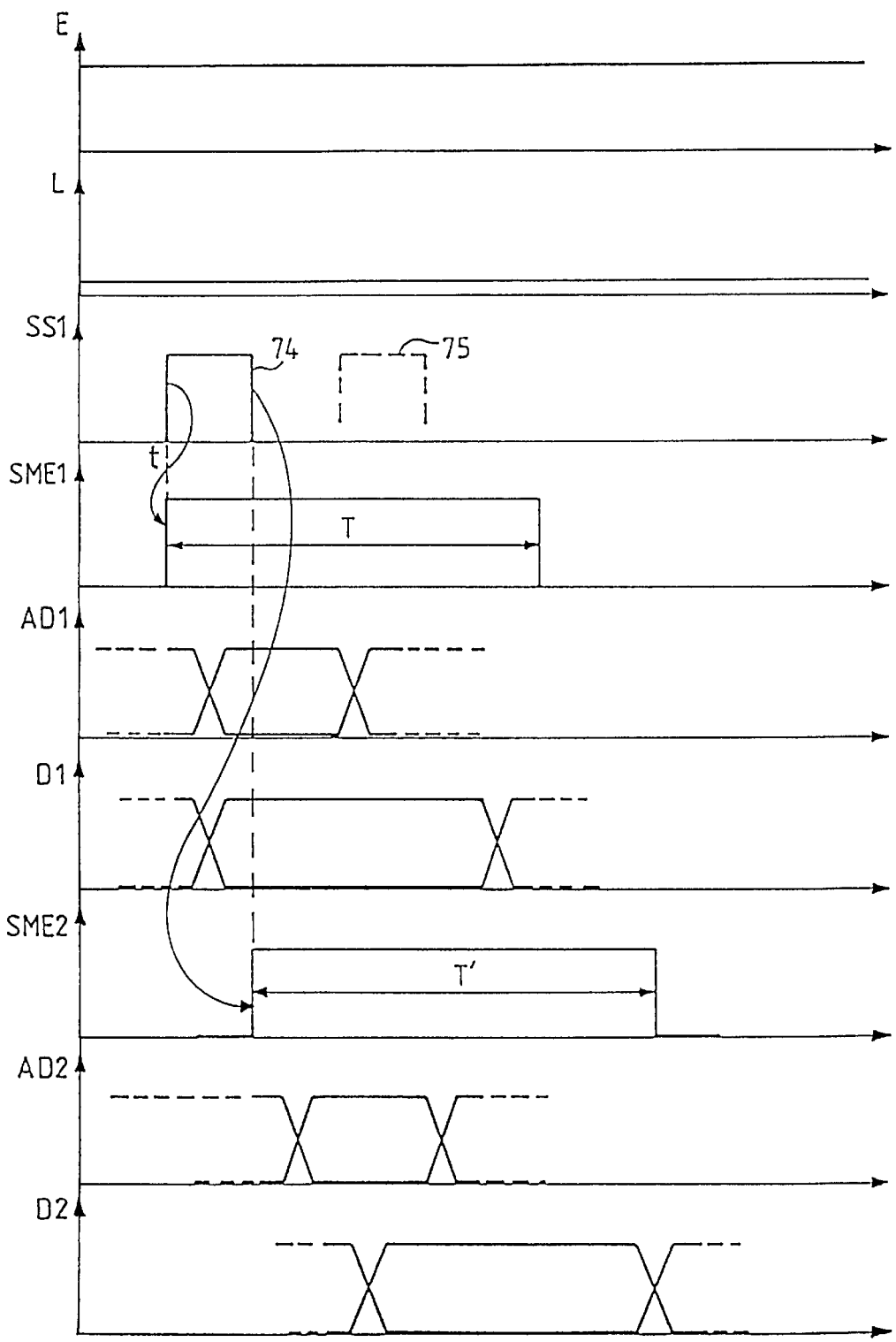
FIG. 2 shows timing diagrams of signals used in one embodiment of the invention.

A description is now given, with reference to FIG. 2, of a mode of use of the circuit of FIG. 1. This mode makes it possible to highlight the operation of the two microcontrollers 4 and 6 executing write operations independently in each memory.

It is assumed here that the write control signal E is active. The top of FIG. 1 shows that the signal E is active (at the level 1) while the signal L is inactive. However, it is not necessary for these signals to complement one another. In the case of the selection of the memory 2, an active selection signal SS1 (level 1) is applied to the input of the selection circuit 5, for example at time t. The circuit 18 automatically places the selection signal SS2 of the memory 3 at a complementary logic level (inactive). The selection signal SS1 activates a time delay signal SME1, with a duration T, by means of the circuit 13. This circuit 13 produces a hold signal SME1 that is characteristic of a selection of write mode for the memory 2. The duration T of this signal SME1 is greater than or equal to the duration of execution of a write operation. The microcontroller 4 is therefore enabled by this signal having a duration T, applied to the gate 11. It is at the same time not influenced by a trailing edge 74 of the signal SS1 or even to an untimely signal 75 if any.

The holding signal produced at the output of the gate 11 commands the microcontroller to execute the write operation in the memory 2. The addresses AD1 sent on the bus 37, following the write order E or selection order SS1, are presented to the output of the address demultiplexer 34. The demultiplexer 34 accurately orients the addresses that it receives, either because it receives a command to this effect from the microcontroller 4 or because it distinguishes those buffer memories 35 or 36 that have to be called into play as a function of the address read on the bus 37. As a variant, the two buffer memories 35 and 36 have the same addresses, and the microcontroller 4 enables the address buffer memory 35 and data buffer memory 41 while the microcontroller 6 enables the address buffer memory 36 and data buffer memory 42 through connections 76 to 79 respectively. In this case, the microcontrollers 4 and 6 interpret the signals delivered by the OR gates 11 and 12. The address bits AD1 stored in the buffer memories 35 are applied to the decoder 7. They provide for the selection of one or more word lines of the memory 2.

Similarly, the data elements D1 are presented at the output of the data multiplexer 38 and the input of the buffer memory 41. The load pump 32 is activated at the same time as the buffer memory. It is used to bias the bit lines of the memory at programming voltages. Thus, on the basis of the addresses AD1 available in the buffer memory 35 and the data elements D1 available in the buffer memory 41, the microprocessor or microcontroller 4 (which continues to be enabled by the signal with a duration T) prompts the desired programming in the memory 2.

Once the selection signal SS1 has made it possible for these actions to be activated, the signal SS1 return to low back after or before the transfer of data elements or addresses in the buffer memories 41 and 35, according to the normal mode or according to an alternative mode. In normal mode, the transfers of addresses and data elements may even precede the command given by the signal SS1 if the control of the demultiplexers 34 and 38 is external.

At the time of the trailing edge 74 of the selection signal SS1, the signal SS2 becomes active. It permits a selection of the memory 3. The selection signal SS2, if the write signal has remained active, activates a time delay signal SME2 with a duration T' coming from the circuit 14. The duration produced by the circuit 14 is not necessarily the same as the duration T of the circuit 13. It depends on the speed of programming of the memory 3 as compared with that of the memory 2. A holding signal is produced accordingly at the output of the logic circuit 12 to enable the microcontroller 6. The microcontroller 6 then operates independently and may execute the write operation in the memory 3.

The write operations are simultaneous in the two memories if the edge 74 occurs before the end of the duration T. FIG. 2 gives a view, towards the bottom, of the transfers of addresses AD2 and transfers of data D2 necessary for the programming of the memory 3.

As soon as the time delay signal is activated, the microcontroller carries out the write operations independently of the value of the selection signal. This period of autonomy is taken advantage of by activating the writing in the other memory.

The present invention can be applied in operating tests for which the duration of the testing time is a factor of productivity. The write and read operations may be done in two distinct memories of the same integrated circuit. This reduces the time and the cost of the test.

The manner in which the writing operation is carried out also is applicable to the reading operation. Inasmuch as a write operation lasts about 500 microseconds, the value of executing two such operations at the same time can be seen. For the read operation, it is appropriate, on a read cycle of some microseconds, to note that a cell reading operation lasts about 100 nanoseconds. With a method of the invention, the reading is begun in a memory. While it continues, the reading is begun in the other memory. Then it is possible to carry out a reselection (by synchronization) of the bus 46 of the first memory (then the bus 47) with the multiplexer elements 50 to ensure the transfer of the data read on the bus 71.

In the case of the read operation, of course, the duration T" and the duration T"' of the signals SML1 and SML2 delivered by the circuits 25 and 26 (which may be equal to each other) should be greater than or equal to the time of the reading duration. They may be also greater than or equal to the time of writing duration.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. An integrated circuit comprising:

first and second memories;

a selection circuit to select the first and second memories;

a first circuit to enable one of a write operation and a read operation in the first memory in response to the first memory being selected by the selection circuit; and a second circuit to enable one of a write operation and a read operation in the second memory in response to the second memory being selected by the selection circuit, while the first memory is enabled to perform one of a write and a read operation.

2. The circuit of claim 1, wherein the first circuit enables the one of the write and the read operation for a predetermined time greater than or equal to the time required for an execution of the operation.

3. The circuit of claim 2, wherein the second circuit enables the one of the write and the read operation for a second predetermined time greater than or equal to the time required for an execution of the operation.

4. The circuit of claim 3, further comprising first and second microcontrollers coupled to the first and second circuits and adapted to execute read and write operation in the first and second memories respectively.

* * * * *